(12) United States Patent
Hughes

(10) Patent No.: US 6,377,105 B1
(45) Date of Patent: Apr. 23, 2002

(54) ON-CHIP HIGHER-TO-LOWER VOLTAGE INPUT STAGE

(75) Inventor: Peter Hughes, Westbury-on-Trym (GB)

(73) Assignee: STMicroelectronics Limited, Almondsbury (GB)

( * ) Notice: Subject to any disclaimer, the term of this patent is extended or adjusted under 35 U.S.C. 154(b) by 0 days.

(21) Appl. No.: 09/486,294

(22) PCT Filed: Jun. 30, 1998

(86) PCT No.: PCT/GB98/01900

§ 371 Date: Jan. 19, 2001

§ 102(e) Date: Jan. 19, 2001

(87) PCT Pub. No.: WO00/01070

PCT Pub. Date: Jan. 6, 2000

(51) Int. Cl.⁷ .............................................. H03L 5/00
(52) U.S. Cl. ...................................... 327/333; 327/77
(58) Field of Search ..................... 326/80, 81; 327/309, 327/318, 319, 320, 321, 325, 327, 328, 333, 77

(56) References Cited

U.S. PATENT DOCUMENTS

| 4,670,861 A | 6/1987 | Shu et al. ................... 365/181 |
| 5,132,573 A | 7/1992 | Tsuru et al. ................. 307/475 |
| 5,317,214 A | 5/1994 | Lewis ......................... 307/475 |
| 5,412,262 A | 5/1995 | Nishio et al. ................ 326/110 |
| 5,541,534 A | 7/1996 | Cao et al. .................... 326/81 |
| 5,663,663 A | 9/1997 | Cao et al. .................... 326/81 |
| 5,670,907 A | 9/1997 | Gorecki et al. ............. 327/535 |
| 5,677,643 A | 10/1997 | Tomita ........................ 327/78 |
| 5,742,183 A | 4/1998 | Kuroda ........................ 326/81 |

OTHER PUBLICATIONS

Chuck Benz et al.,*An Error–Correcting Encoder and Decoder for a 1 GBIT/S Fiber Optic Link*, proceedings of the custom integrated Circuits Conference, San Diego, May 12–15, 1991, no. Conf. 13, May 12, 1991, pp. 7.1.1–7.1.4, XP000295692.

*Primary Examiner*—Jeffrey Zweizig
(74) *Attorney, Agent, or Firm*—Wolf, Greenfield & Sacks, P.C.; James H. Morris

(57) ABSTRACT

An input stage of an integrated circuit comprising a first and a second voltage divider, and a comparator, each voltage divider comprising a respective first MOS transistor in series with a diode-connected second MOS transistor connected between a first and a second supply rail, outputs of each divider being input to a comparator, the gate of the first MOS transistor of the first divider providing the circuit input and the gate of the first MOS transistor of the second divider being responsive to a reference voltage, where the aspect ratios of the first and second MOS transistors of the first divider are selected to overcome oxide stress when the circuit input voltage lies outside the voltages on the first and second supply rails.

8 Claims, 2 Drawing Sheets

ON-CHIP HIGHER-TO-LOWER VOLTAGE INPUT STAGE

BACKGROUND OF THE INVENTION

1. Field of the Invention

The present invention relates to an 'on-chip' higher-to-lower voltage input stage. More particularly, the present invention relates to an input stage, incorporated as part of a monolithic integrated circuit, that is capable of carrying out voltage level conversion where the input voltage to the input stage is capable of exceeding at least one of the voltages applied to the input stage's voltage supply rails.

2. Background Art

FIG. 1 illustrates a known circuit for translating one voltage to another voltage.

This circuit 100 comprises two n-type MOS transistors MN1 and MN2 operatively arranged to form what is commonly referred to as a 'source follower'; so called since the voltage appearing on the source terminal of transistor MN1 tracks, or follows, that which is applied to its gate terminal. Transistor MN1 has its drain terminal connected to a positive supply rail VDD, its source terminal 110 is connected to the drain and gate terminals of transistor MN2 and its gate control terminal 120 receives a first voltage V1. Transistor MN2 has its source connected to the supply rail VSS. An output voltage Vout, which is derived from the first voltage V1, appears at the common connection 110 between transistors MN1 and MN2. Transistor MN2 is a diode connected transistor and therefore acts as an active resistor, alternatively transistor MN2 can be considered as acting as a current source.

A circuit 100 such as that shown in FIG. 1 is used in analogue circuit designs and one application is a voltage divider. If such a circuit 100 were to be used as an input stage of an integrated circuit it would incorporate additional circuitry for protection against Electro-Static Discharge (ESD): such ESD protection shall be described in more detail in relation to FIG. 2.

FIG. 2 illustrates a known CMOS inverting stage 200.

The inverting stage 200, including its Electro-Static Discharge protection diodes D1 and D2, which would typically be seen at an input pin of a digital integrated circuit (not illustrated), comprises p-type and n-type transistors MP3 and MN3.

Transistor MP3 has its source terminal connected to a positive supply rail VDD, its respective drain and gate terminals 210, 220 are connected to the respective drain and gate terminals of transistor MN3. Transistor MN3 has its source connected to the supply rail VSS. The respective input and output voltages Vin, Vout of the stage appear at the respective common gate and drain terminals 220, 210 of transistors MP3 and MN3.

Diode D1 has its anode connected to the supply rail VSS and its anode connected to the gate terminal 220. Diode D2 has its anode connected to the gate terminal 220 and its cathode connected to a supply rail VDD.

It should be noted that when the input voltage Vin exceeds the supply voltage VDD, diode D2 would act to clamp the input voltage Vin to a value of approximately VDD+VD: where VD is the forward voltage drop of a diode. Such clamping would be an undesirable effect and disadvantageous to an 'on-chip' higher-to-lower voltage input stage.

As the semiconductor process technologies advance the reduction in the geometry's of transistors, and hence the overall size of integrated circuits, also leads to a reduction in the supply voltages which in turn leads to lower power, more efficient electronic circuits, systems and apparatus. For a number of years the supply voltage for many integrated circuits remained, and still remain, at 5 volts. However, due to the advances in process technology these supply voltages are being driven down to lower values. For example, 5 volt CMOS circuits are being replaced with circuits that operate on approximately 2 and 3 volt technology. Therefore, there is a need for an 'on-chip' higher-to-lower voltage input stage that will allow 5 volt and 3 volt technology, for example, to be interfaced without the need of costly external circuits and components.

Therefore, due to the aforementioned disadvantage and associated problems in relation to a need for an interface between such 2/3 volt and 5 volt technologies, for example, solutions have been proposed. One such proposal in the form of a circuit which is taught in the U.S. Pat. No. 5,151,619 to Austin et al., which is herein incorporated by reference. However, there is an associated problem associated with the circuit of U.S. Pat. No. 5,151,619 in that it is an 'off-chip' solution and as such it increases the component count and complexity, size and the cost of a system employing such an arrangement.

OBJECTS & SUMMARY OF THE INVENTION

Accordingly, an object of the present invention is to provide circuitry that overcomes the aforementioned problems and/or disadvantages.

Another object of the present invention is to provide a circuit that is tolerant of an input voltage that exceeds at least one of its voltage supply rails.

Another object of the present invention is to provide a circuit that can be used as a x to y volt level translator, where the magnitude of x is greater than that of y.

Another object of the present invention is to provide a level translator circuit that is input voltage tolerant and that can be incorporated within a monolithic analogue and/or digital integrated circuit.

In order to achieve these objects, the present invention proposes an input stage of an integrated circuit that comprises: first and second voltage dividers 305, 305'; and a comparator 325; said first and second voltage dividers, which are operatively connected between second positive and negative voltage supply rails VDD, VSS, respectively receiving an input and reference voltage Vin, Vref and respectively providing first and second outputs voltages Vout 1, Vout 2, said output voltages being input to the comparator, which is operatively connected between said second voltage rails, for providing a third output voltage Vout3, said input voltage being supplied on an input terminal 320 by first circuitry 330, that is supplied from first positive and negative voltage supply rails VH, CL, wherein the input voltage can pass beyond a voltage applied to at least one of the second voltage supply rails.

According to another embodiment of the present invention, the voltage dividers each comprise an MOS type transistor and a current source CS1, CS1' that are operatively connected in series between said second positive and negative voltage supply rails, the gate 320 of said transistor of said first voltage divider being responsive to the input voltage, the gate 320' of said transistor of said second voltage divider being responsive to the reference voltage, the current sources of said respective first and second voltage dividers being responsive to their respective output voltages.

According to another embodiment of the present invention the input terminal is operatively connected to second circuitry D1, D2 for operatively protecting the input stage against electrostatic discharge, said second circuitry being operatively connected between the first positive voltage supply rail and the second negative voltage supply rail.

According to another embodiments of the present invention the first and second negative voltage supply rails are connected together and the MOS transistors MN1, MN1' are n-type MOS transistors having their drain terminals connected to the second positive voltage supply rail and their source terminals connected to the second negative voltage supply rail via their respective first and second current sources.

According to another embodiment of the present invention the input voltage is capable of increasing beyond a voltage applied to the second positive voltage supply rail.

According to another embodiment OLD the present invention the first and second negative voltage supply rails are at a voltage substantially equal to the ground potential of the input stage and the first and second circuitry and the second positive voltage supply rail is at a voltage less than +5 volts but greater than the voltage of the first and second negative voltage supply rail.

According to another embodiment of the present invention the second positive voltage supply rail has an applied voltage substantially in the range of +1 volt to +4 volts.

According to another embodiment of the present invention the first and second current sources are replaced by first and second resistive elements.

According to other embodiments of the present invention the resistive element is a passive and/or active resistive element.

According to other embodiments of the present invention the active resistive element is an operatively n-type diode connected MOS transistor MN2.

According to other embodiments of the present invention the integrated circuit incorporating an input stage according to the present invention is used in a system or apparatus that is incorporated within, or that is used in conjunction with, a computer; a domestic or consumer appliance; a vehicle; or a telephone or a telephone network.

BRIEF DESCRIPTION OF THE DRAWINGS

These and other objects, as well as other advantages and features, of the present invention will become apparent in light of the following detailed description and accompanying drawings among which.

DETAILED DESCRIPTION OF THE INVENTION

In the following diagrams, where the same or similar elements appear, they will be denoted in the same manner.

Figure 3:
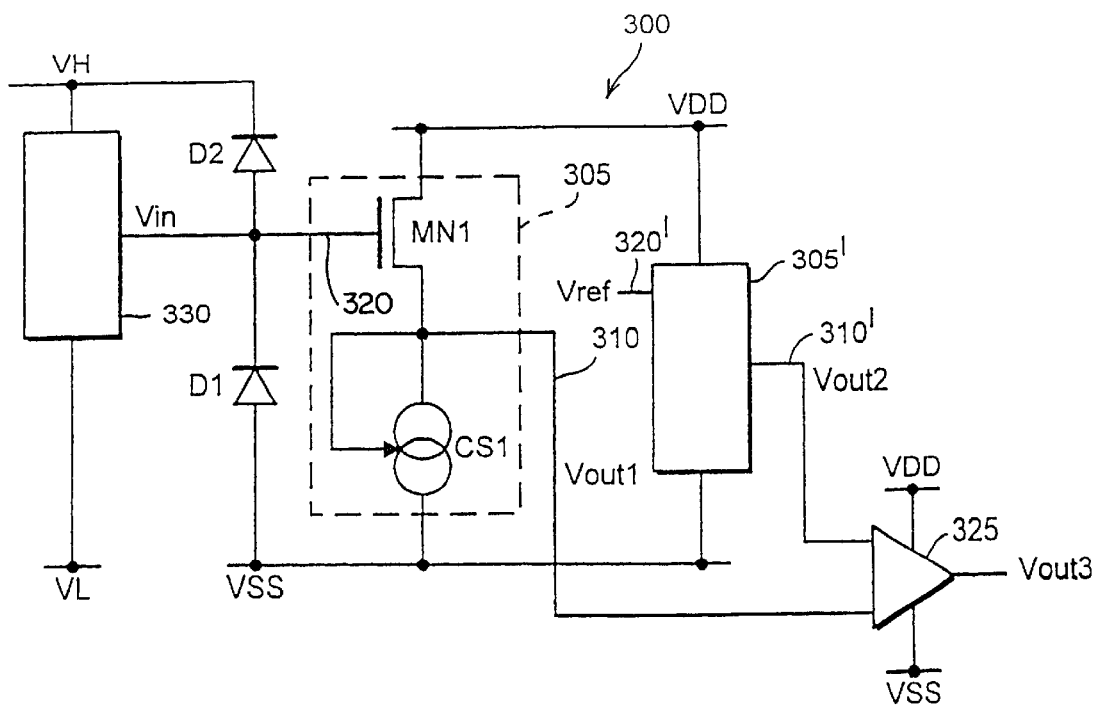
FIG. 3 illustrates a input stage according to the present invention.

FIG. 3 illustrates an embodiment of a basic schematic diagram, according to the present invention, for translating an input voltage Vin to an output voltage Vout1.

Circuit 300, which is incorporated as part of an integrated circuit (not illustrated), comprises two voltage divider stages 305, 305', circuitry D1, D2 for providing protection against Elecro-Static Discharge (ESD) and a comparator 325. Also illustrated in FIG. 3 is a circuit, system or apparatus 330, which is not incorporated as part of the aforementioned integrated circuit, that provides the input voltage Vin.

The voltage divider stage 305 comprises an n-type MOS transistor MN1 and a current source CS1.

Transistor MN1 has its drain terminal connected to a positive supply rail VDD, its source terminal 310 is connected to the negative supply rail VSS, via the current source CS1, while the gate control terminal 320 of transistor MN1 receives the input voltage Vin.

Current source CS1 has its most positive terminal connected to the drain terminal 310 of transistor MN1 and its most negative terminal connected to a negative supply rail VSS and is controlled in response to the output voltage Vout1. The output voltage Vout1 appears at the common connection 310 between transistor MN1 and the current source CS1.

The voltage divider stage 305', like the voltage divider stage 305, comprises an n-type MOS transistor MN1' (not illustrated) and a current source CS1' (not illustrated) that are connected in the same manner as MN1 and CS1. However, voltage divider stage 305', unlike the voltage divider stage 305, receives a reference voltage Vref on the gate terminal 320' of transistor MN1. The reference voltage Vref, which is preferably, but not- necessarily, generated 'on-chip' is used as the voltage from which an output voltage Vout2 of stage 305' is derived.

The ESD protection is provided for by the two diodes D1 and D2. Diode D1 has its anode connected to the supply rail VSS and its cathode connected to the gate terminal 320 of transistor MN1. Diode D2 has its anode connected to the gate terminal 320 of transistor MN1 and its athode connected, according to an embodiment of the present invention, to a supply rail VH, which is the positive supply rail for the circuit, system or apparatus 330.

It should be noted that it is possible to have ESD protection using circuitry (not illustrated) which does not have an electronic component connected between the gate terminal 320 and the supply rail VH, yet such circuitry provides ESD protection that is comparable to that provided by diodes D1 and D2 in FIG. 3.

The comparator 325, which is connected between the supply rails VDD and VSS, receives the output voltages Vout 1 and Vout2. The voltage Vout 2 acts as the comparators reference voltage and the comparator 325 provides a VSS-to-VDD-to-VSS digital output voltage Vout3.

The circuit 300 can be used as an input voltage translator in analogue and/or digital circuits where the range of the input voltage Vin applied to the gate 320 of transistor MN1 can exceed, i.e. pass beyond, the voltage applied to the positive supply rail VDD, i.e. where VSS≦Vin>VDD.

It should be noted that the circuit 300 of FIG. 3 can be implemented by means of a p-type MOS transistors MP1/MP1' (not illustrated) and an operative current sources CS2/CS2' (not illustrated). Transistor MP1 having its source terminal connected to the positive supply rail VDD, via the current source CS2, its drain terminal is connected to the negative supply rail VSS, while its gate control terminal receives the input voltage Vin. Current source CS2 having its most positive terminal connected to the positive supply rail VDD and its most negative terminal is connected to the source terminal of transistor MP1 and being controlled in response to the output voltage Vout, which appears at the common connection between transistor MP1 and the current source CS2. Transistor MP2' and current source CS2' being connected accordingly.

The principal of operation of this circuit 300 by means of p-type MOS transistor technology is the same as that which will be described below for n-type MOS transistor technology associated with circuit 300 and will therefore for reasons of brevity not be described herein since those skilled in the art will, by analogy, be able to deduce its operation. Suffice to say that the range of the input voltage Vin applied to the gate control terminal of transistor MP1 can exceed, i.e. pass beyond in a negative sense, the voltage applied to the negative supply rail VSS, i.e. where VSS≦Vin>VDD.

The circuit, system or apparatus 330 could be used in, or form an output stage of, a multitude of applications, whether digital and/or analogue in nature. Such applications, for example, being computer and associated peripherals, a domestic and/or consumer appliance, a telephone or a telephone network, industrial test equipment, or vehicle based. More specific application examples, which are intended for illustrative purposes only and are not intended to be exhaustive, include: televisions; VCRs; radios and HiFi's; satellite receivers; video games and associated peripherals; washing machines and dryers; fridges and freezers; microwave ovens; toasters; hairdryers; mobile telephones; telephone answering machines; automobile engine and systems management.

The important point concerning the circuitry 330 is that it is supplied by positive and negative supply rails, respectively VH and VL, that have a voltage difference between them that is greater than that of circuit 300, i.e. (VH−VL)>(VDD−VSS).

At present in the field of integrated circuits, a typical example for the supply voltages involved are approximately VH−VL=5 volts and VDD−VSS=3 volts. Obviously, as technology advances these values would change. However, until these two values converge sufficiently, there would be a relative difference, and not necessarily a 2 volt difference, that would need to be taken into account when integrating circuits, systems and apparatus that are designed to be supplied from different voltages. The 5 volt and 3 volt examples are intended for illustrative purposes only and are not intended to be limiting.

Figure 1:
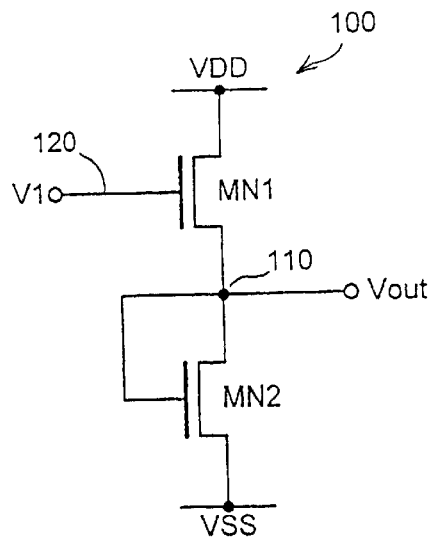
FIGS. 1 and 2 have already been depicted as exposing the state of art and the problems to overcome.

The current source CS1 can be implemented in a multitude of different ways, including being replaced by a resistor, whether an active or passive resistor. According to a preferred embodiment of the present invention it shall from hereafter be assumed that the current source CS1 has been replaced by the diode connected transistor MN2, as discussed above in relation to FIG. 1.

According to the present invention an 'on-chip' input stage is provided that is firstly 'tolerant' to an input voltage being supplied that exceeds one of its supply rails and secondly that provides ESD protection.

The term 'tolerant' above is used in connection with the tolerance of the gate oxide of a MOS transistor when there is an excessive voltage applied across it, i.e. when the gate oxide is excessively stressed. In general terms, the more by which an input voltage, i.e. a gate voltage, exceeds a supply voltage the greater the gate oxide stress, until eventually the gate oxide is ruptured due to breakdown or punchthrough, in which case the transistor, and indeed its associated circuit, will no longer continue to operate. Even if the gate oxide did not rupture it would over a period of exposure to excessive gate oxide stress become 'leaky' due to, for example, hot electron injection. The amount by which an input voltage would have to exceed a supply voltage before the occurrence of gate oxide breakdown or punchthrough will depend upon the thickness of the gate oxide. The thicker the oxide the greater the amount by which an input voltage could exceed a supply voltage and vice-versa. Typically for a 0.5 micrometer gate length process technology the gate oxide thickness would be in the range of 7–9 nanometer. Such an oxide thickness would result in a maximum voltage range of typically 3.5 to 4.5 volts that could be supported across the gate oxide before gate oxide degredation starts to become an issue for concern.

Figure 2:
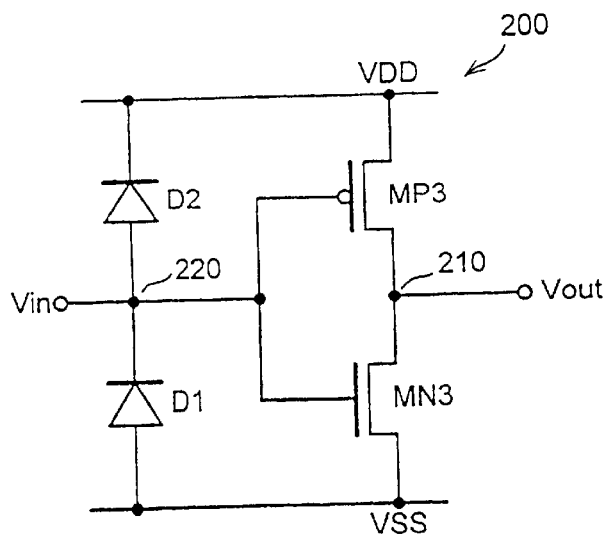

According to the present invention, the ESD protection diode has its cathode connected to the supply rail VH, which is the positive supply rail for the circuit, system or apparatus 330. Therefore, such an arrangement will avoid any of the disadvantages associated with the arrangement of FIG. 2. As a result the input voltage Vin is clamped to its own positive supply voltage VH and not to that of the circuit 300, i.e. VDD.

According to the present invention, by careful selection of the relative aspect ratios, i.e. the gate width-to-length ratios (W/L ratios), of transistors MN1 and MN2 for a known set of process and application characteristics, the current disadvantages relating to oxide stress can be overcome.

The aspect ratios of transistors MN1 and MN2 can be controlled in such a manner so as to limit the amount of stress experienced by the gate oxide of transistor MN1. Since for most of the input voltage range Vin both transistors MN1 and MN2 are in saturation, therefore, their relationship $(VgS-Vt)_{MN1}/(Vgs-Vt)_{MN2}$ (where Vgs denotes gate-to-source voltage and Vt denotes threshold voltage) is fixed by the relationship:

$$\sqrt{\frac{W_{MN2} \cdot L_{MN1}}{W_{MN1} \cdot L_{MN2}}} \quad \text{(equation 1)}$$

According to the present invention, having an approximate square root value 0.5 for equation 1 would result in an output voltage Vout of approximately 2.6 volts for an input voltage Vin of 5 volts and a supply voltage (VDD−VSS) of approximately 3 volts. This value of 2.6 is for illustrative purposes only, since each technology process and each application has its own characteristics which those skilled in the art would know and take into consideration.

Therefore in an example such as illustrated above, an output voltage of 2.6 volts will, for a 5 volt input voltage, be within the limits for avoiding hot electron injection since the voltage difference between the gate terminal 320 of transistor MN1 and the supply voltage VDD and output voltage Vout is approximately 2.5 volts.

The applications for a circuit such as that illustrated in FIG. 3 are analogue, i.e. where the input voltage Vin is a analogue voltage, and/or digital.

Although this invention has been described in connection with certain preferred embodiments, it should be understood that the present disclosure is to be considered as an exemplification of the principles of the invention and that there is no intention of limiting the invention to the disclosed embodiments. On the contrary, it is intended that all alternatives, modifications and equivalent arrangements as may be included within the spirit and scope of the appended claims be covered as part of this invention.

What is claimed is:

1. An input stage of an integrated circuit, said input stage comprising a first voltage divider, a second voltage divider, and a comparator, wherein each voltage divider comprises a respective first MOS transistor in series with a diode-connected second MOS transistor connected between a first and a second supply rail, outputs of each voltage divider being input to said comparator, a gate of the first MOS transistor of the first voltage divider receiving a circuit input voltage and the gate of the first MOS transistor of the second voltage divider being responsive to a reference voltage, wherein width to length ratios of the first and second MOS transistors of the first voltage divider are selected to overcome oxide stress when the circuit input voltage lies outside voltages on said first and second supply rails.

2. The input stage according to claim 1, wherein the width to length ratio of said second MOS transistor divided by the width to length ratio of said first MOS transistor is a quantity having a square root of approximately 0.5.

3. The input stage according to claim 1, wherein each of the four MOS transistors of the first and second voltage dividers is N type.

4. The input stage of claim 1, further comprising circuitry on said integrated circuit for generating said reference voltage.

5. The combination of an integrated circuit and circuitry providing an input to an input terminal of said integrated circuit, said integrated circuit and said circuitry having respective first and second sets of supply terminals wherein a voltage difference between positive and negative supply terminals of said first set is greater than a voltage difference between positive and negative supply terminals of said second set, said integrated circuit comprising a first voltage divider and a second voltage divider, a reference voltage supply having an output and a comparator, each voltage divider comprising a respective first MOS transistor in series with a diode-connected second MOS transistor connected between said second set of supply terminals, said comparator receiving outputs of said first and second voltage dividers and providing a comparator output therefrom, each first transistor having a respective gate, the gate of the first MOS transistor of the first voltage divider being connected to said input terminal and the gate of the first MOS transistor of the second voltage divider being connected to the output of the reference voltage supply, said input terminal having ESD protection circuitry comprising two series diodes, a cathode of one of said diodes being connected to the positive supply terminal of said first set of supply terminals and an anode of the other of said diodes being connected to the negative supply terminal of said second set of supply terminals whereby a signal at said input terminal is not clamped to at least one of the supply terminals of the second set of supply terminals of said integrated circuit.

6. The combination of claim 5 wherein width to length ratios of the first and second MOS transistors of said first divider are selected to overcome oxide stress when a voltage at said input terminal lies outside voltages on said positive and negative supply terminals of said second set.

7. The combination of claim 5 wherein for said first voltage divider a width to length ratio of said second MOS transistor divided by a width to length ratio of said first MOS transistor is a quantity having a square root of approximately 0.5.

8. The combination of claim 5 wherein each of the four MOS transistors of the first and second voltage dividers is N type.

* * * * *